United States Patent
Lynch (10) Patent No.: US 10,881,156 B2
(45) Date of Patent: Jan. 5, 2021

(54) SUPPORTING AN ELECTRICAL CONNECTOR

(71) Applicant: Wearable Technology Limited, Leicester (GB)

(72) Inventor: Michael John Lynch, Leicester (GB)

(73) Assignee: Wearable Technology Limited, Leicester (GB)

( * ) Notice: Subject to any disclaimer, the term of this patent is extended or adjusted under 35 U.S.C. 154(b) by 0 days.

(21) Appl. No.: 16/192,912

(22) Filed: Nov. 16, 2018

(65) Prior Publication Data

US 2019/0200683 A1   Jul. 4, 2019

(30) Foreign Application Priority Data

Dec. 29, 2017   (GB) .................................. 1722268.8

(51) Int. Cl.
*H01R 13/622* (2006.01)
*A41D 1/00* (2018.01)
(Continued)

(52) U.S. Cl.
CPC ............... *A41D 1/002* (2013.01); *A41D 1/04* (2013.01); *A41D 3/00* (2013.01); *H01R 12/62* (2013.01); *H01R 12/716* (2013.01); *H01R 13/516* (2013.01); *H01R 43/205* (2013.01); *H05K 1/142* (2013.01); *H05K 3/28* (2013.01); *H05K 3/368* (2013.01); *A41D 1/005* (2013.01); *H01B 3/46* (2013.01); *H01B 7/0846* (2013.01); *H01R 13/5845* (2013.01); *H01R 13/622* (2013.01); *H05K 2201/10356* (2013.01); *H05K 2201/209* (2013.01); *H05K 2203/1327* (2013.01)

(58) Field of Classification Search
CPC ...... A41D 1/002; H01R 12/62; H01R 13/516; H05K 1/142
See application file for complete search history.

(56) References Cited

U.S. PATENT DOCUMENTS 3,170,209 A * 2/1965 Parry ........................ A41F 1/00
                                                                 24/379.1
6,319,015 B1 * 11/2001 Faunce .................. H01R 11/22
                                                                 24/662
(Continued)

FOREIGN PATENT DOCUMENTS

CN    107536180 A    1/2018
GB      2531020 A    4/2014

OTHER PUBLICATIONS

Corresponding Great Britain Search Report, Application No. 1722268.8, dated Jun. 28, 2018.

*Primary Examiner* — Binh B Tran
*Assistant Examiner* — Krystal Robinson
(74) *Attorney, Agent, or Firm* — Cooper Legal Group, LLC (57) ABSTRACT

An electrical connector having a detachable interface and a permanent interface is supported by connecting the permanent interface to a circuit-board. A first loom end (303) and a second loom end (305) are connected to the circuit board and an over-moulding (404) is applied to cover the permanent interface, the first loom end and the second loom end. The detachable interface is located through an orifice in an item of clothing (410) and the over-moulding is secured to an internal surface of an item of clothing by a first side flange (404) and a second side flange (405).

20 Claims, 6 Drawing Sheets

(51) Int. Cl.
  *H05K 3/36* (2006.01)
  *H05K 3/28* (2006.01)
  *H01R 12/71* (2011.01)
  *H01R 12/62* (2011.01)
  *H01R 43/20* (2006.01)
  *H01R 13/516* (2006.01)
  *A41D 1/04* (2006.01)
  *A41D 3/00* (2006.01)
  *H05K 1/14* (2006.01)
  *H01B 3/46* (2006.01)
  *H01R 13/58* (2006.01)
  *H01B 7/08* (2006.01)

(56) References Cited

U.S. PATENT DOCUMENTS

| | | | | |
|---|---|---|---|---|
| 7,462,035 B2* | 12/2008 | Lee | | H01R 12/592 |
| | | | | 439/121 |
| 8,308,489 B2* | 11/2012 | Lee | | H01R 13/2407 |
| | | | | 2/69 |
| 9,819,103 B2* | 11/2017 | Fournier | | H02G 15/013 |
| 9,819,122 B1* | 11/2017 | Lewallen | | A41D 1/005 |
| 10,108,227 B2* | 10/2018 | Yong | | H01R 12/7011 |
| 10,310,558 B2* | 6/2019 | Lewallen | | A61B 5/1118 |
| 10,588,551 B2* | 3/2020 | Ko | | A61B 5/1473 |
| 10,617,155 B2* | 4/2020 | Komoto | | H01R 13/73 |
| 10,757,991 B2* | 9/2020 | Patz | | A41D 3/00 |
| 2007/0026695 A1* | 2/2007 | Lee | | H01R 13/6277 |
| | | | | 439/37 |
| 2010/0100997 A1* | 4/2010 | Lee | | H01R 13/2407 |
| | | | | 2/69 |
| 2015/0342269 A1* | 12/2015 | Oleson | | A61B 5/6804 |
| | | | | 439/37 |
| 2016/0270727 A1* | 9/2016 | Berg | | A61B 5/0006 |
| 2017/0017265 A1 | 1/2017 | Vacas Jacques | | |
| 2017/0112200 A1* | 4/2017 | Mason | | H01R 13/73 |
| 2017/0279230 A1* | 9/2017 | Komoto | | H01R 13/73 |
| 2017/0288338 A1* | 10/2017 | Komoto | | H01R 13/6278 |
| 2018/0003579 A1* | 1/2018 | Esposito | | A61B 5/6806 |
| 2019/0148901 A1* | 5/2019 | Komoto | | A44B 99/00 |
| | | | | 439/271 |
| 2020/0027329 A1* | 1/2020 | Lynch | | G08B 5/224 |
| 2020/0128670 A1* | 4/2020 | Chong Rodriguez | | |
| | | | | H05K 1/0272 |

* cited by examiner

SUPPORTING AN ELECTRICAL CONNECTOR

CROSS REFERENCE TO RELATED APPLICATIONS

This application claims priority from United Kingdom Patent Application number 1722268.8, filed on Dec. 29, 2017, the whole contents of which are incorporated herein by reference.

BACKGROUND OF THE INVENTION

The present invention relates to an apparatus for supporting an electrical connector. The present invention also relates to a method of supporting an electrical connector.

It is known to attach peripheral equipment to items of clothing. However, known systems assume that the items of clothing are robust and have substantial strength.

Increasingly, high visibility garments are being worn in hazardous environments. Often the garments are made from relatively lightweight material. Thus, a problem exists in terms of attaching known peripheral devices using widely available interface systems.

BRIEF SUMMARY OF THE INVENTION

According to a first aspect of the present invention, there is provided an apparatus for supporting an electrical connector, wherein: said electrical connector is configured to provide a mechanically detachable electrical interface for equipment external to a surface of an item of clothing, while providing permanent electrical connections with a transmission loom internal to said item of clothing; and said electrical connector has a rigid component, having an external mechanical/electrical interface portion configured to extend externally through an orifice defined in said item of clothing, and an internal electrical interface portion; wherein said apparatus comprises: a circuit board including first contacts attachable to said internal electrical interface portion; an over-moulding configured to surround said circuit-board; a first side-flange extending away from a first side of said over-moulding; and a second side flange extending away from a second side of said over-moulding, wherein said first flange and said second flange are used to attach said over-moulding to an internal surface of the item of clothing.

In an embodiment, the attachment means also includes stitches for stitching said first-side-flange and said second-side-flange to said internal surface.

According to a second aspect of the present invention, there is provided a method of supporting an electrical connector having a detachable interface and a permanent interface, comprising the steps of: connecting said permanent interface to a circuit-board; connecting a first loom end to said circuit board and connecting a second loom end to said circuit board; over-moulding said circuit-board to cover said permanent interface, said first loom end and said second loom end; locating said detachable interface through an orifice in an item of clothing; and securing said over-moulding to an internal surface of said item of clothing by securing a first side flange of said over-moulding; and securing a second side flange of said over-moulding.

Embodiments of the invention will be described, by way of example only, with reference to the accompanying drawings. The detailed embodiments show the best mode known to the inventor and provide support for the invention as claimed. However, they are only exemplary and should not be used to interpret or limit the scope of the claims. Their purpose is to provide a teaching to those skilled in the art.

DETAILED DESCRIPTION OF EMBODIMENTS OF THE INVENTION

FIG. 1

Figure 1:
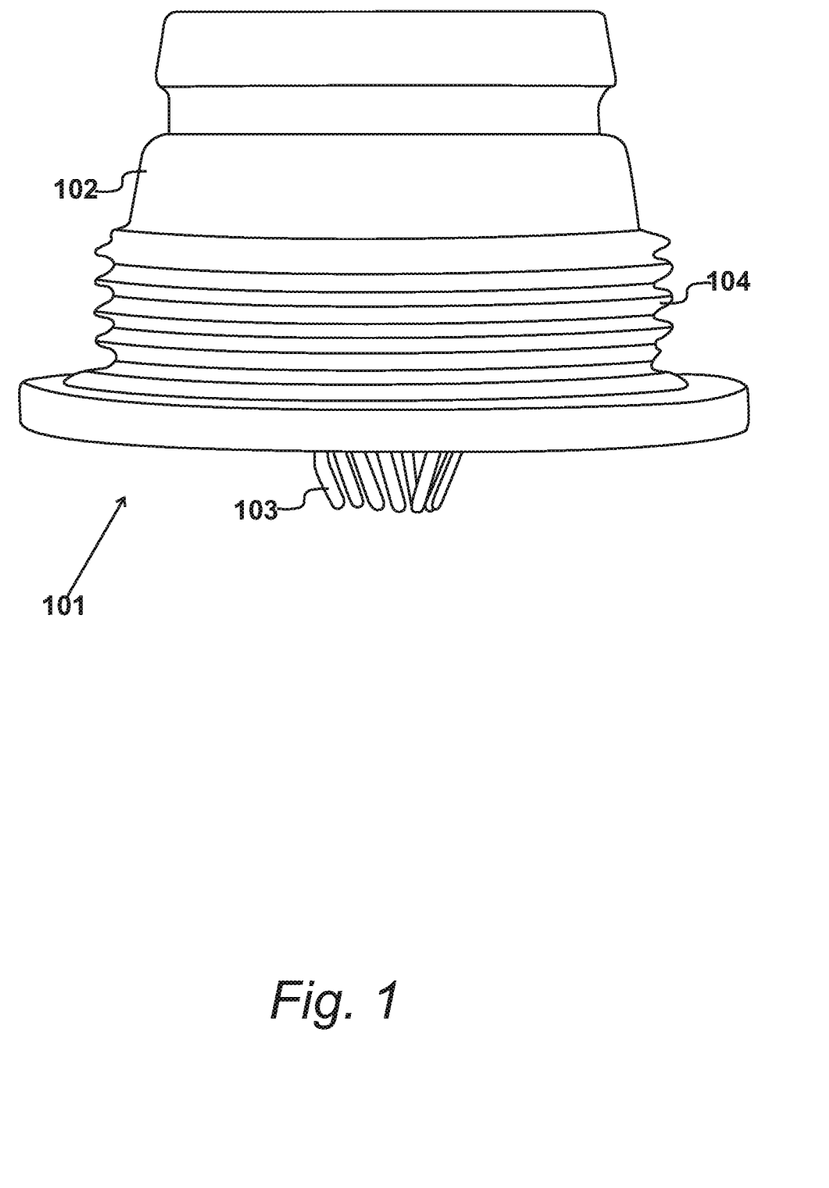
FIG. 1 shows an electrical connector.

An electrical connector 101 is shown in FIG. 1, configured to provide a mechanically detachable electrical interface for equipment that is supported on the external surface of an item of clothing: such as, for example, a high visibility vest, jacket or parka.

The electrical connector may be a Freedom LP360 type device available from Fischer Connectors of St-Prez, Switzerland. The electrical connector 101 includes a rigid component 102 that is configured to extend externally through an orifice defined in an item of clothing. In addition, the connector 101 also includes an internal electrical interface portion 103.

Many connectors of this type include a central threaded region 104, for securing the connector; possible using an appropriately threaded nut. In the present embodiment, such an approach has been rejected, given that the removal of devices of this configuration often places excessive force on items of clothing, that in turn may lead to material being damaged. Thus, in an alternative embodiment, the threaded section 104 is not present and the overall depth of the device is reduced.

FIG. 2

Figure 2:
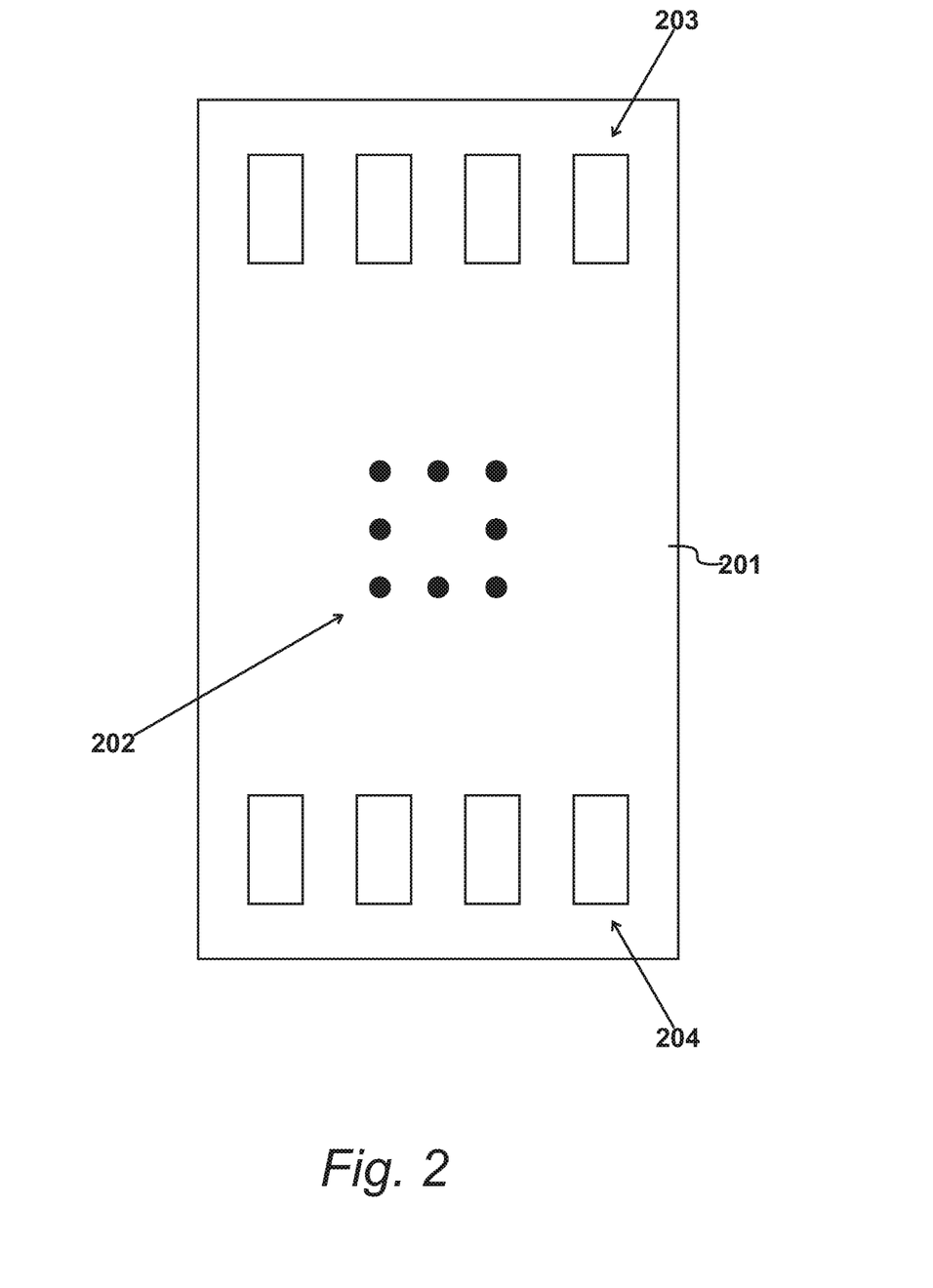
FIG. 2 a circuit board for supporting the electrical connector of FIG. 1.

An apparatus for supporting an electrical connector of the type shown in FIG. 1, includes a first circuit board 201, as shown in FIG. 2. The first circuit board 201 includes first contacts 202 that are attachable to the internal electrical interface portion 103 of the electrical connector.

The circuit board 201 also includes a first set of loom connectors 203 and a second set of loom connectors 204.

FIG. 3

Figure 3:
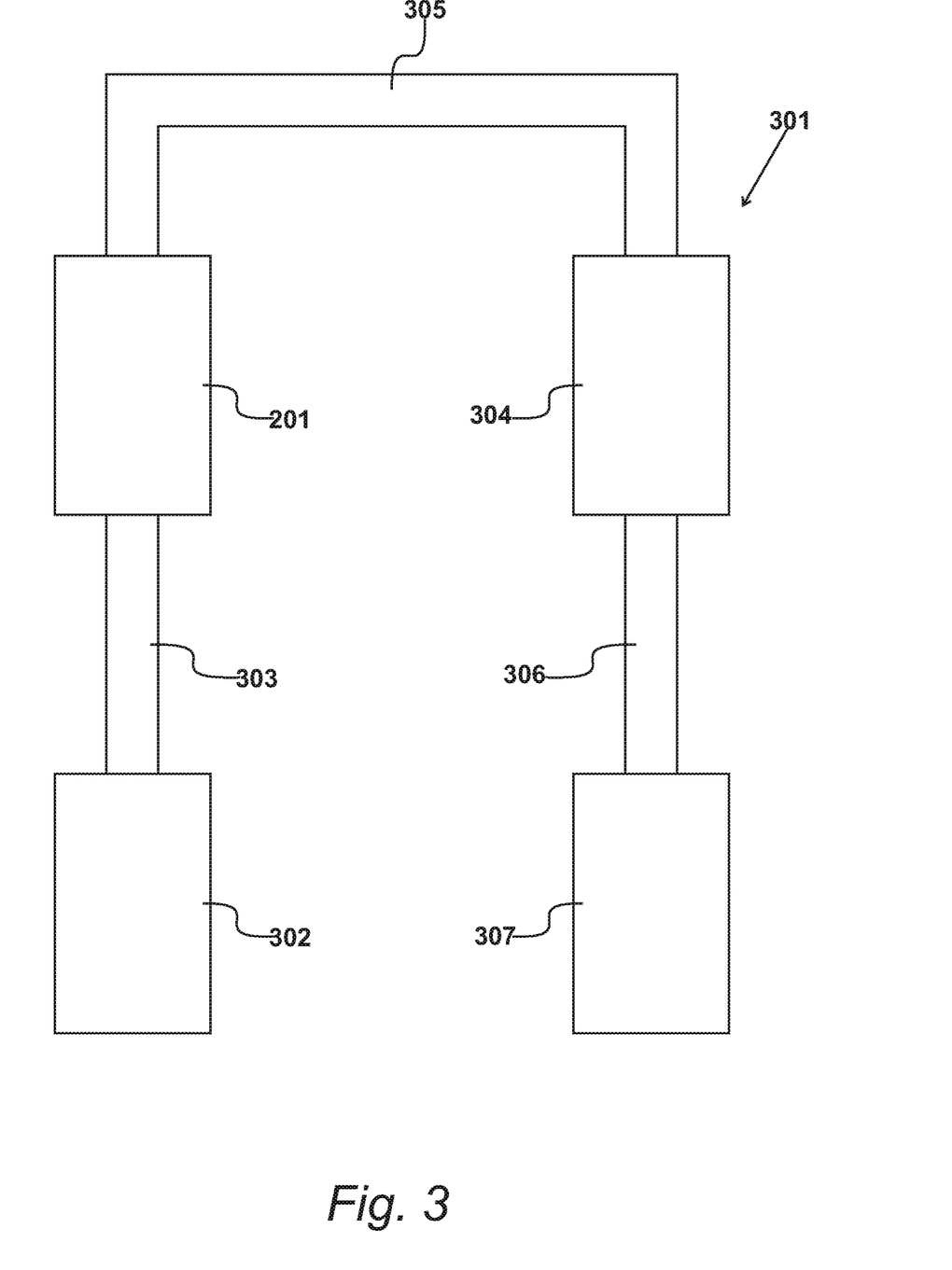
FIG. 3 shows a loom assembly, configured by connecting devices of the type shown in FIG. 2.

A loom sub-assembly 301 is constructed, as shown in FIG. 3, by connecting the first circuit board 201 to a second circuit board 302 with a first loom portion 303. The first circuit board is also connected to a third circuit board 304 by a second loom portion 305. A third loom portion 306 also connects the third circuit board 304 to a fourth circuit board 307. It should also be appreciated that the chain can be extended by attaching further circuit boards in a similar configuration.

FIG. 4

Figure 4:
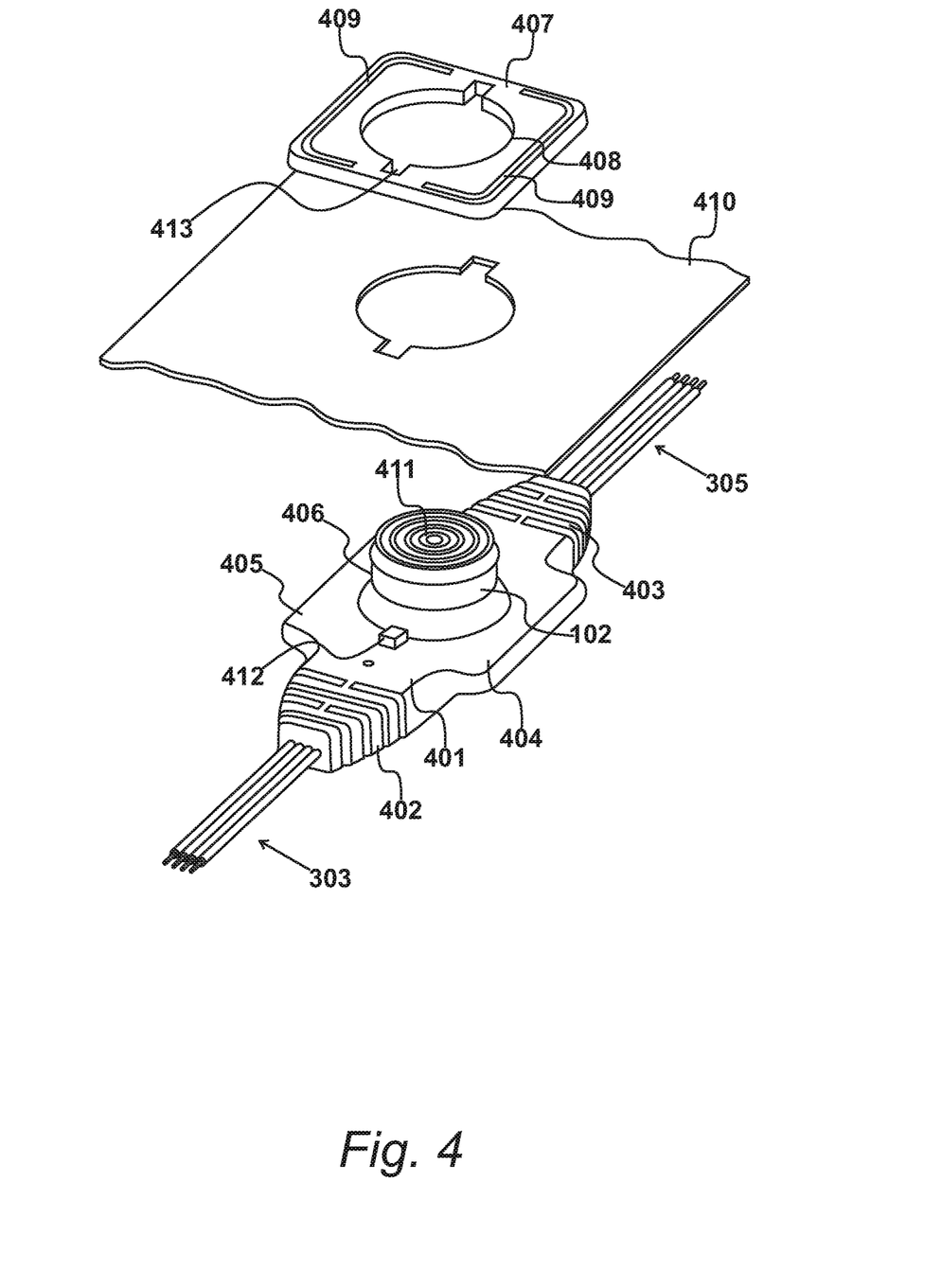
FIG. 4 shows the application of an over-moulding.

To complete a loom sub-assembly, the first contacts 202 of each circuit board receive a connector of the type described with reference to FIG. 1. The combination of the circuit board 201, the connector 101, an end of the first-loom-portion 303 and an end of the second-loom-portion 305 are then over moulded in rubber to provide an over-moulding 401.

The over-moulding 401 includes a first strain-relief portion 402 for supporting the first loom portion 303. In addition, a similar second strain-relief portion 403 is provided for the second loom portion 305.

To provide a means of attachment, the over-moulding 401 includes a first side flange 404 and a second side flange 405. In an embodiment, the first side flange 404 and the second side flange 405 are glued to an underside of an item of clothing. Alternatively, or in addition, the over-moulding 401 is attached to a garment by stitching the first side flange 404 and the second side flange 404 to the garment. Thus, it should be appreciated that, in this embodiment, the first side flange 404 and the second side flange 405 extend beyond the position of the circuit board contained within the over-moulding 401.

The over-moulding 401 includes an orifice 406 for receiving the rigid component 102. In an embodiment, an outer moulding 407 is also provided that includes a similar orifice 408 for receiving the rigid component 102. In an embodiment, the outer moulding 407 also includes indications 409 for receiving stitches, such that the stitches extend through the outer moulding 407, an item of clothing 410 and the over moulding 404.

In the embodiment of FIG. 4, the first loom portion 303 is a silicone rubber insulated ribbon cable. The silicone rubber provides hard-wearing insulation that also protects loom conductors during washing cycles. Thus, the loom becomes a permanent sub-assembly, forming part of the item of clothing. External devices are then connected to the supported electrical connectors when required, but removed for washing and storage.

In an embodiment, a control unit and a power supply are housed within a dedicated external device. This may then control and communicate with other devices connected to the loom. Data transmission may occur at low bandwidth over the loom or a Bluetooth pairing may be made when higher bandwidth transmissions are required. In an alternative embodiment, higher bandwidth communication is possible over the loom, such that Bluetooth communication is not necessary within the personal area network.

In the embodiment of FIG. 4, the mechanically detachable electrical interface presents a circular surface 411. The circular surface is substantially parallel to the outer surface of the garment and includes a plurality of concentric electrical connectors.

In the embodiment of FIG. 4, the over-moulding 401 includes at least one notch 412 for insertion within a notch hole 413 within the outer-moulding 407.

FIG. 5

Figure 5:
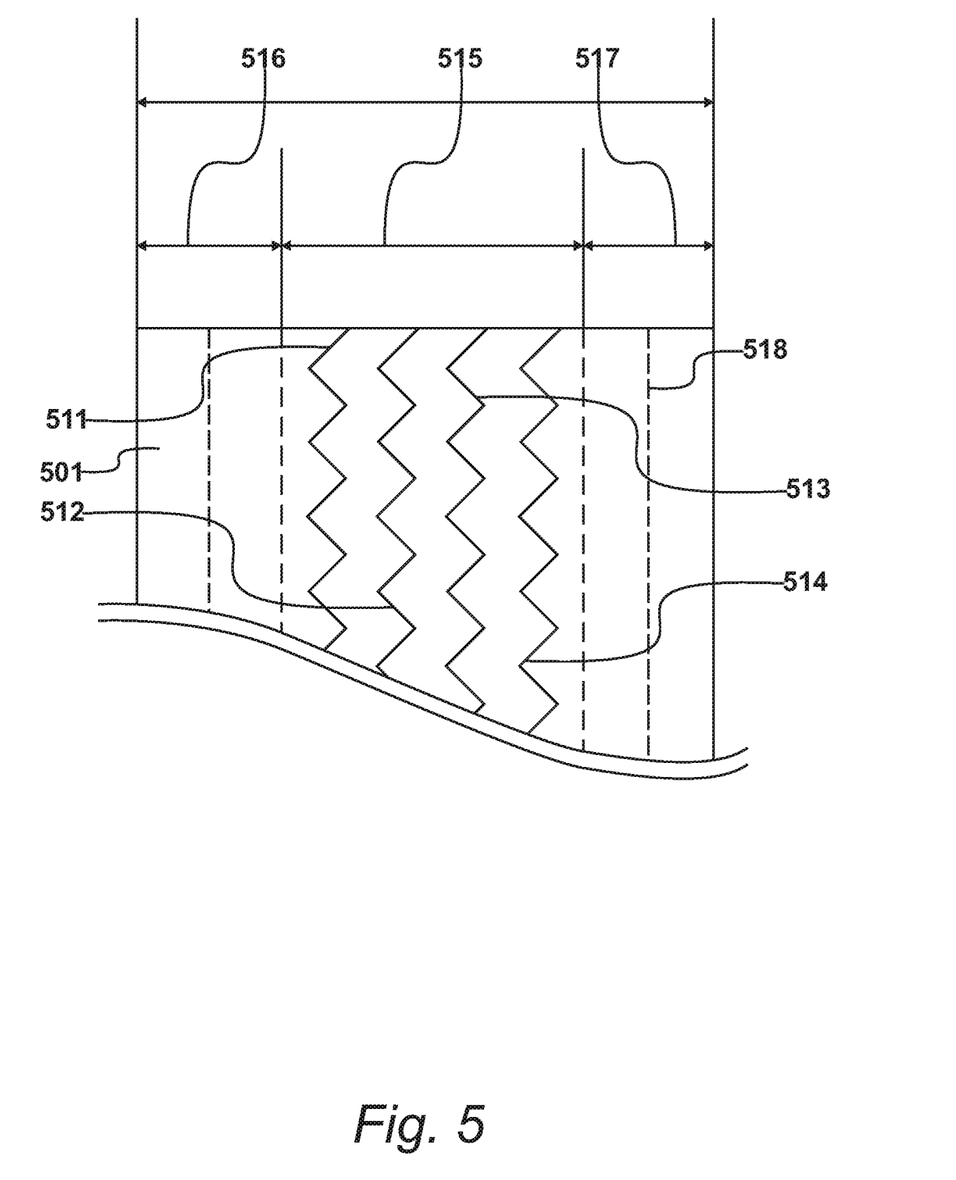
FIG. 5 shows an alternative loom cable.

An alternative configuration for the first loom portion is illustrated in FIG. 5. Instead of using a ribbon cable, for which substantially all of the ribbon is conductive, the alternative first loom portion of FIG. 5 is constructed from a ribbon of non-conductive material 501. However, a first-conductive-wire 511, a second-conductive-wire 512, a third-conductive-wire 513 and a fourth-conductive-wire 514 are included. The conductive wires 511 to 514 are cut and connected to circuit boards to create a loom. The non-conductive material 501 remains uncut and passes through the over-mouldings.

The conductive wires 511 to 514 are restrained within a central portion 515 of the ribbon. A first edge portion 516 provides a non-conductive region that may be sewn into an item of clothing; possibly at the position of an existing seam. In this embodiment, a second edge portion 517 is also provided to facilitate additional sewing to firmly secure the loom within the item of clothing. Sewing positions may be indicated by providing additional coloured thread 518.

FIG. 6

Figure 6:
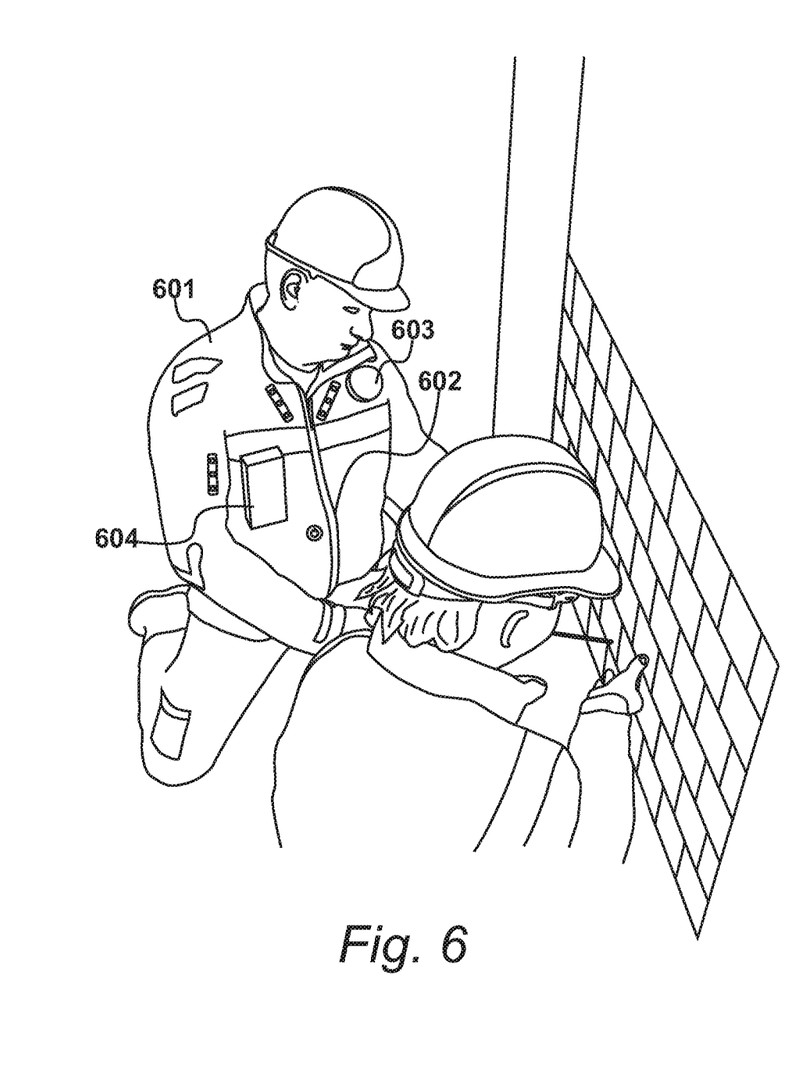
FIG. 6 shows an item of clothing with external connectors.

An item of clothing 601 is shown in FIG. 6, having external connectors supported by an internal loom. The loom, in the form or a ribbon of the type described with reference to FIG. 5 has been sewn into the item of clothing at the position of seams, such as seam 602.

A camera 603 has been attached as a first peripheral device. This communicates with a control unit 604 attached as a second peripheral device. The control unit controls operation of the camera 603 and also supplies electrical power to the camera 603.

The invention claimed is:

1. An apparatus for supporting an electrical connector, wherein:
   said electrical connector is configured to provide a mechanically detachable electrical interface for equipment external to a surface of an item of clothing, while providing permanent electrical connections with a transmission loom internal to said item of clothing;
   said electrical connector has a rigid component, having an external mechanical/electrical interface portion configured to extend externally through a first orifice defined in said item of clothing, and an internal electrical interface portion; and
   said apparatus comprises:
      a circuit board including first contacts attachable to said internal electrical interface portion; and
      an over-moulding configured to surround said circuit board and having said rigid component extending therethrough, wherein said over-moulding includes:
         a first side flange extending away from said rigid component in a first direction; and
         a second side flange extending away from said rigid component in a second direction, wherein said first side flange and said second side flange are used to attach said over-moulding to an internal surface of the item of clothing.

2. The apparatus of claim 1, wherein said apparatus includes stitches for stitching said first side flange and said second side flange to said internal surface.

3. The apparatus of claim 2, wherein said apparatus includes an outer-moulding having a second orifice for receiving said external mechanical/electrical interface portion.

4. The apparatus of claim 3, wherein:
   said outer-moulding includes indications for receiving said stitches; and
   said stitches extend through said outer-moulding, said item of clothing and said over-moulding.

5. A loom sub-assembly, comprising:
   a plurality of electrical connectors configured to detachably attach external equipment, wherein each electrical connector of said plurality of electrical connectors is supported by said apparatus of claim 1, wherein a first loom portion connects a first circuit board to a second circuit board.

6. The loom sub-assembly of claim 5, wherein said first loom portion is a ribbon cable insulated with silicone rubber.

7. The loom sub assembly of claim 6, further comprising a second loom portion connecting said second circuit board to a third circuit board.

8. The loom sub-assembly of claim 7, further comprising a third loom portion connecting said third circuit board to a fourth circuit board.

9. The loom sub-assembly of claim 5, wherein said first loom portion is constructed from a ribbon of non-conductive material, with conductive wires included therein.

10. The loom sub-assembly of claim 9, wherein:
a first end of said conductive wires connect to said first circuit board; and
a second end of said conductive wires connect to said second circuit board, to maintain the integrity of said first loom portion.

11. An item of clothing having said loom sub-assembly of claim 9, wherein:
said conductive wires are restrained within a substantially central-portion of said ribbon; and
said ribbon is sewn into position within said item of clothing along a first-edge-portion of said ribbon.

12. The item of clothing of claim 11, wherein said ribbon is also sewn into position along a second-edge-portion.

13. The item of clothing of claim 11, including coloured thread included in said ribbon to indicate a sewing position.

14. The loom sub-assembly of claim 5, wherein said mechanically detachable electrical interface presents a circular surface arranged substantially parallel with said surface, including a plurality of concentric electrical connectors.

15. The loom sub assembly of claim 14, wherein:
said mechanically detachable electrical interface is substantially cylindrical;
said first orifice is substantially cylindrical, with at least one additional notch hole; and
said over-moulding includes at least one notch for insertion within said respective notch hole to maintain alignment of said electrical connector.

16. A method of supporting an electrical connector configured to provide a mechanically detachable electrical interface for equipment external to a surface of an item of clothing, while providing a permanent electrical connections with a transmission loom internal to said item of clothing, wherein:
said electrical connector has a rigid component, having an external mechanical/electrical interface portion configured to extend externally through a first orifice defined in said item of clothing, and an internal electrical interface portion; and
said method comprising the steps of:
connecting said internal electrical interface portion to a circuit board including first contacts attachable to said internal electrical interface portion;
connecting a first loom end of said transmission loom to said circuit board and connecting a second loom end of said transmission loom to said circuit board;
over-moulding said circuit board to surround said circuit board while enabling said rigid component to extend therethrough;
locating said external mechanical/electrical interface portion through said first orifice defined in said item of clothing; and
securing said over-moulding to an internal surface of said item of clothing by securing a first side flange of said over-moulding extending away from said rigid component in a first direction and securing a second side flange of said over-moulding extending away from said rigid component in a second direction.

17. The method of claim 16, further comprising the step of locating a cover over said surface of said item of clothing, wherein said cover includes a cover-orifice for receiving said external mechanical/electrical interface portion.

18. The method of claim 17, wherein said securing step includes:
sewing through said cover, said item of clothing and said first side flange; and
sewing through said cover, said item of clothing and said second side flange.

19. An apparatus for supporting an electrical connector, wherein:
said electrical connector is configured to provide a mechanically detachable electrical interface for equipment external to a surface of an item of clothing, while providing permanent electrical connections with a transmission loom internal to said item of clothing;
said electrical connector has a rigid component, having an external mechanical/electrical interface portion configured to extend externally through a first orifice defined in said item of clothing, and an internal electrical interface portion; and
said apparatus comprises:
a circuit board including first contacts attachable to said internal electrical interface portion;
an over-moulding configured to surround said circuit board;
a first side flange extending away from a first side of said over-moulding;
a second side flange extending away from a second side of said over-moulding, wherein said first side flange and said second side flange are used to attach said over-moulding to an internal surface of the item of clothing;
stitches for stitching said first side flange and said second side flange to said internal surface; and
an outer-moulding having a second orifice for receiving said external mechanical/electrical interface portion, wherein:
said outer-moulding includes indications for receiving said stitches; and
said stitches extend through said outer-moulding, said item of clothing and said over-moulding.

20. A loom sub-assembly, comprising:
a plurality of electrical connectors configured to detachably attach external equipment, wherein each electrical connector of said plurality of electrical connectors is supported by said apparatus of claim 19, wherein a first loom portion connects a first circuit board to a second circuit board.

* * * * *